United States Patent [19]
Koteles et al.

[11] Patent Number: 5,757,023
[45] Date of Patent: May 26, 1998

[54] FABRICATION OF QUANTUM WELL POLARIZATION INDEPENDENT ACTIVE DEVICES

[75] Inventors: Emil S. Koteles; Jian Jun He, both of Ottawa; Sylvain Charbonneau, Cumberland; Philip J. Poole, Ottawa, all of Canada

[73] Assignee: National Research Council of Canada, Ottawa, Canada

[21] Appl. No.: 787,958

[22] Filed: Jan. 23, 1997

Related U.S. Application Data

[60] Provisional application No. 60/010,561, Jan. 25, 1996.
[51] Int. Cl.$^6$ ............................................. H01L 29/06
[52] U.S. Cl. .................... 257/18; 257/21; 385/130; 438/59
[58] Field of Search ............................. 257/14, 15, 18, 257/19, 21; 385/130, 131; 438/59, 542

[56] References Cited

U.S. PATENT DOCUMENTS

| | | | |
|---|---|---|---|
| 5,090,790 | 2/1992 | Zucker | 385/130 |
| 5,238,868 | 8/1993 | Elman et al. | 437/126 |
| 5,395,793 | 3/1995 | Charbonneau et al. | 437/133 |

*Primary Examiner*—Sara W. Crane
*Attorney, Agent, or Firm*—Neil Teitelbaum Associates

[57] ABSTRACT

An active semiconductor device that performs in a substantially polarization independent manner. A quantum well waveguide is intermixed by intermixing atoms across an interface between well and barrier layers. The atoms include at least 2 groups wherein intermixing of one group is at a substantially greater rate than another group. Cations are interdiffused at a greater rate than said anions across interfaces between well and barrier layers. The intermixing must be sufficient to provide strain within layers of the waveguide and sufficient to at least partially degenerate light hole and heavy hole bands of the structure. Preferably intermixing is sufficient to completely degenerate light hole and heavy hold bands to essentially produce a device that is completely polarization independent.

14 Claims, 6 Drawing Sheets

FABRICATION OF QUANTUM WELL POLARIZATION INDEPENDENT ACTIVE DEVICES

This application claims priority based on provisional application No. 60/010,561, filed Jan. 25, 1996.

FIELD OF THE INVENTION

This invention relates to a method for fabricating polarization insensitive active devices and relates to polarization insensitive active devices.

BACKGROUND OF THE INVENTION

In optical communications, there is a need for a high performance polarization insensitive optoelectronic active device such as an optical amplifier, detector, modulator or the like which can be, if necessary, integrated with other optoelectronic devices to form so-called photonic integrated circuits.

It has been well known for some time now that the addition of quantum wells (QW) into a heterostructure has significant beneficial effects on the performance of many active semiconductor devices. Laser diode threshold currents are reduced, optical amplifier output powers are increased, photodetectivities are enhanced, device speeds are increased, etc. However, the degeneracy of light and heavy hole valence bands at the Brillouin zone center is lifted in quantum structures. The symmetry of these two bands differs, so their coupling to electromagnetic waves also differs, leading to a large polarization sensitivity in such QW devices. This can lead to serious difficulties when such devices are employed in fiber optical networks since standard fiber is not capable of maintaining the polarization of their guided modes. Since the performance of QW devices such as optical amplifiers, modulators, optical switches, and photodetectors are highly polarization sensitive, the uncertainty of the polarization of an incoming signal will produce a strong deterioration in performance when these devices are employed in optical communications.

Figure 1A:
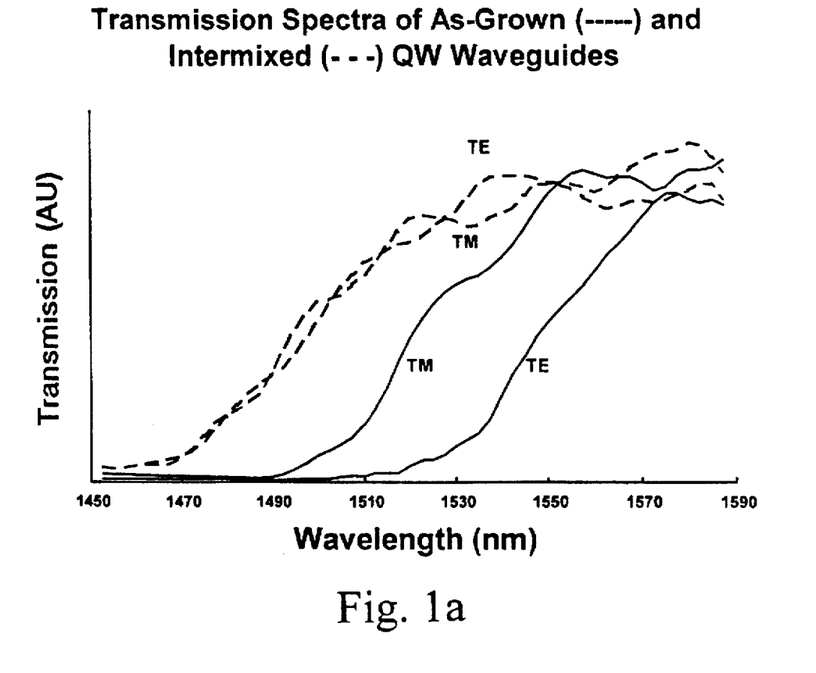
FIG. 1a is a graph illustrating the TE (transverse electric) and TM (transverse magnetic) transmission spectra of an as-grown and also an intermixed InGaAs/InGaAsP QW waveguide under zero applied external bias conditions.
Figure 1B:
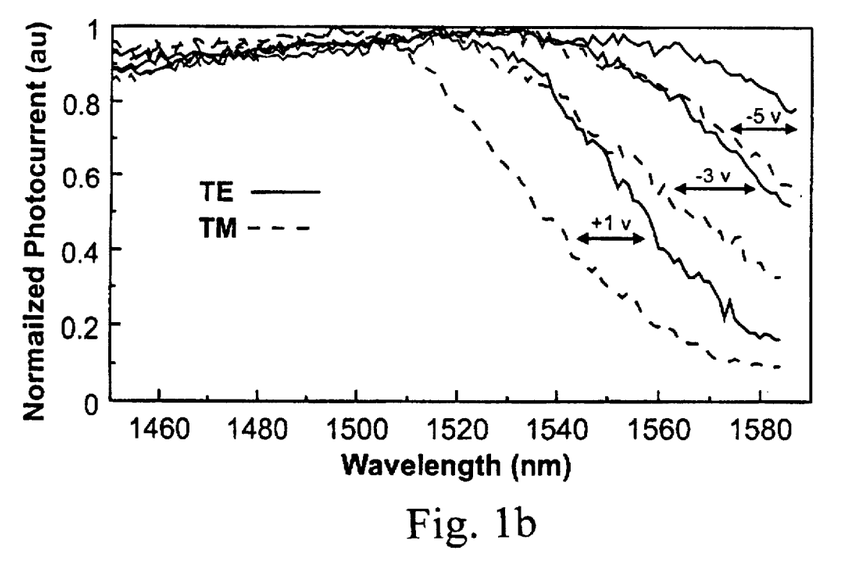
FIG. 1b is a graph of Photocurrent (absorption) spectra of an as-grown, lattice matched InGaAs/InGaAsP QW waveguide as a function of external bias and for two orthogonal polarizations the waveguide modes.

It is well established that the performance of many semiconductor heterostructure optoelectronic devices such as lasers, optical amplifiers, and Stark effect modulators is enhanced through the incorporation of quantum well (QW) layers in their design. For example, it has been demonstrated that in QW optical amplifiers, quantum and differential quantum efficiencies, gain, and saturation output power are all increased. However, active devices incorporating QWs have one major drawback; their performance is highly polarization sensitive due to the lifting of the degeneracy of the heavy hole (HH) and light hole (LH) valence bands at the Brillouin zone center by quantum confinement. Thus, in a semiconductor waveguide containing QWs, the bandgap energy is a function of the polarization of the propagating beam with respect to the plane of the waveguide (labeled TE-transverse electric—or TM-transverse magnetic). In FIG. 1, the bandgap energy of a p-i-n QW waveguide is determined using wavelength dependent photoconductivity which is equivalent to the absorption spectrum. Under an external bias of +1 volt which effectively cancels the built-in electric field of the p-i-n QW waveguide and produces the so-called flatband condition, the measured bandgap energy with TE polarized light is smaller, corresponding to a wavelength of about 1.555 μm, than that of TM polarized light, corresponding to a wavelength of about 1.540 μm. TE light interacts with both the light hole (LH) and heavy hole (HH) valence bands while TM light only interacts with the higher energy LH band. Thus the difference in bandgap energy as determined by TE and TM bandgaps is a direct measure of the LH-HH valence band energy splitting in the QW. This structure, whether operated as a photodetector, quantum confined Stark effect modulator, or optical amplifier would be quite sensitive to the signal polarization for wavelengths close to the bandgap, significantly degrading its performance and usefulness. In contrast, bulk, unstrained, III-V zincblende semiconductor waveguide devices are polarization insensitive since their HH and LH bands are degenerate at the Brillouin zone. Clearly, in the best of all worlds, it would be very advantageous to have a waveguide device incorporating the benefits of a QW while simultaneously maintaining bulk-like polarization properties.

To achieve polarization insensitive optical amplification in a QW waveguide, several approaches have been demonstrated based on special geometric designs for active layers, for example, as described by I. Cha et al., Electron. Lett. 25, 1241 (1990), and S. Cole et al., in Electron. Lett. 25, 314 (1990), or by the judicious incorporation of pseudomorphic strain, described by K. Kagari, M. Okamoto, H. Yasaka, K. Sato, Y. Noguchi, and O. Mikami, in IEEE Photon. Technol. Lett. 2, 556 (1990) Although some of these work quite well in eliminating polarization sensitivity of structures incorporating QWs, all of these require very sophisticated growth techniques and thus yield issues become important.

In view of the limitations of prior art devices, it is an object of this invention, to provide optoelectronic devices containing quantum wells, to enhance performance, but which, at the same time are not sensitive to the polarization of the optical signal.

The prior art attempts to provide a polarization insensitive structure generally involve the growth of specialized heterostructures containing several different types of strained epitaxial layers designed to use one type of strained QW to compensate the polarization performance of the other type of strained QW and, although these techniques may work, they are not considered practicable as they are difficult to implement since they generally require a high degree of control over growth and fabrication. Although proven in the laboratory they are not very practical solutions. For example, in one technique both the quantum well width, epitaxial layer compositions, and strain must be controlled to a high degree of accuracy. For PICs, which require a large amount of space on a wafer, this is especially difficult, if not impossible. Moreover, since these structures are so specialized, they generally can perform only one function, unlike standard QW structures which are capable of operating in several different modes: for examples as laser, detector, modulator, transparent waveguide, etc.

SUMMARY OF THE INVENTION

A method is provided for reducing the polarization sensitivity in a QW optoelectronic device in a simple manner. It involves a post growth processing step which is inexpensive and can be easily implemented.

In accordance with this invention, a novel method for fabricating polarization insensitive semiconductor optoelectronic devices incorporating QWs is described. The use of ion implantation induced QW intermixing in, for example, a lattice matched InGaAs/InGaAsP MQW is an attractive alternative to fabricating such devices due to its inherent simplicity and thus practicality. The invention is based on a spatially selective, post-growth, modification of the shape of the QW in a standard laser structure. Such a modification not only blue-shifts the bandgap energy but, in an embodiment described hereafter, also reduces and can eliminate the TE-TM splitting due to the effect of quantum confinement on LH and HH bandgap energies. The origin of this effect, is discussed within the framework of a model based on differing diffusion rates for, by way of example, group III and group V atoms in the structure. In principle, this technique for producing polarization independent optoelectronic devices is applicable to QW devices fabricated from many different material systems.

The technique used to achieve polarization insensitivity comprises QW intermixing to change the shape, composition, and strain in a QW (InGaAs/InGaAsP) in such a manner that the light and heavy hole resonances become degenerate, as in bulk material. Standard QW intermixing in a lattice matched ternary/quaternary/InP QW structure is employed. QW intermixing is a well established technique for altering the shapes of an as-grown InGaAs/InGaAsP QW waveguide, to an arbitrary extent, and in a spatially selective manner, thereby Increasing the bandgap energy of the QW structure.

BRIEF DESCRIPTION OF THE DRAWINGS

Exemplary embodiments of the invention will now be described in conjunction with the drawings, in which.

DETAILED DESCRIPTION

FIG. 1a, is a graph which clearly indicates a large improvement in polarization insensitivity when intermixing in accordance with the principles of this invention is done. The solid lines illustrate the TE (transverse electric) and TM (transverse magnetic) transmission spectra of an as-grown InGaAs/InGaAsP QW waveguide. Note that the oscillations in the curves are an artifact of the measurement technique and are inconsequential to the discussion of the spectra herein. The difference in bandgap energies—the region where the signal increases rapidly defines the bandgap energy of the QW—between these two modes is a consequence of the quantum confinement splitting of heavy and light valence bands and illustrates the polarization sensitivity of an as-grown QW. The dashed lines illustrate the same two modes in an intermixed QW waveguide. In this case the two modes overlap, demonstrating that light and heavy hole valence bands are degenerate, and thus that this waveguide is polarization insensitive. Thus, this intermixed waveguide functions as a polarization insensitive photodetector, optical amplifier, modulator, etc.

In accordance with an embodiment of the invention, the following structure is exemplary and numerous other materials, and methods of implantation may be envisaged.

The nominally unstrained laser structure used in this exemplary embodiment comprises lattice matched InGaAs quantum wells (QWs) having InGaAsP barriers designed for operation at 1.55 μm and grown using MOCVD epitaxy. The structure includes five $In_{0.53}Ga_{0.47}As$ QWs in an $In_{0.74}Ga_{0.26}As_{0.57}P_{0.43}$ active region clad with InP. From the surface the layers are: 0.2 μm Zn-doped ($1 \times 10^{19}$ cm$^{-3}$) $In_{0.53}Ga_{0.47}As$ cap, 1.5 μm Zn-doped ($5 \times 10^{17}$ cm$^{-3}$) InP, 0.05 μm undoped $In_{0.74}Ga_{0.26}As_{0.57}P_{0.43}$, five repeats of 0.02 μm undoped $In_{0.74}Ga_{0.26}AsO_{.57}P_{0.43}$ barrier/6.0 nm undoped $In_{0.53}Ga_{0.47}As$ QW, 0.07 μm undoped $In_{0.74}Ga_{0.26}As_{0.57}P_{0.43}$, 1.0 μm S-doped ($1 \times 10^{18}$ cm$^{-3}$) InP on a S-doped ($5 \times 10^{18}$ cm$^{-3}$) InP substrate.

High energy ion implants were accomplished using the 1.7 MV Tandetron™ Accelerator at the University of Western Ontario. Vacancies, interstitials, and other defects were introduced by implanting phosphorus ions into the sample. A constant flux of 6.6 nA/cm$^2$ was used to implant a dose of $2.5 \times 10^{13}$ cm$^{-2}$ at a substrate temperature of 200° C. with an energy of 1 MeV.[7] Phosphorus ions were used so that no additional impurities (doping) were introduced in the structure. During implantation, the sample was tilted 7° to the surface normal to minimize ion channeling. The expected mean range of the ions, as determined by a simulation program TRIM 91, was 0.88 μm, which is well short of the QW structure located 1.7 μm beneath the surface.

It has been reported previously by P. J. Poole, S. Charbonneau, G. C. Aers, T. E. Jackman, M. Buchanan, M. Dion, R. Goldberg, I. V that, for InGaAs/InGaAsP QWs embedded in InP cladding layers, a strong correlation exists between the PL energy shift after implantation and annealing and the calculated total vacancy creation in the sample per implanted ion. This observation suggested that defects are extremely mobile in InP during annealing and that, wherever they are created in the structure, they can diffuse into the QW region to promote intermixing. Therefore, an increase in either dose or energy of the implanted ions—both affect the total vacancy concentration—leads to an increase in intermixing. For simplicity, the dose was fixed and the energy of the ions reaching the semiconductor structure varied by masking different parts of the sample with different thicknesses of SiO$_2$, obtained through standard UV lithography and SiO$_2$ PECVD evaporation. The maximum SiO$_2$ thickness was chosen so that the 1 MeV P$^+$ions would be completely stopped in the SiO$_2$, leaving unimplanted material beneath. In a recent paper by S. Charbonneau, P. J.

Poole, Y. Feng, G. C. Aers, M. Dion, M. Davies, R. D. Goldberg and E. Koteles it was demonstrated that such a masking technique could be used to tune (blue shift) the emission wavelength of an InP based 1.5 µm laser structure. It was also established that passive waveguides can be fabricated from a laser structure using this technique with no additional loss.

After implantation and after removal of the mask the structure was annealed in a $N_2$ atmosphere using an AG Associates 410 Rapid Thermal Annealer (RTA) at a temperature of 700° C for 90 seconds. The sample surface was protected from desorption during the anneal by placing a large piece of GaAs material face down upon it. The rapid thermal anneal (RTA) enhanced the naturally occurring thermal driven interdiffusion across the interfaces of the QWs and removed non-radiative recombination sites. Low temperature photoluminescence (PL) measurements were made to verify the bandgap shift and to optimize the processing conditions. No degradation of surface quality was observed after the implantation and annealing. The PL and absorption blue shifts observed after intermixing originate primarily from the increase in bandgap of the QW material due to QW shape modification.

For vacancy enhanced QW intermixing to be a useful technique for device fabrication, it is important that the electrical characteristics of the p-i-n structure not be degraded by the implantation or anneal. It has been reported by J. E. Zucker, B. Tell, K. L. Jones, M. D. Divino, K. F. Brown-Goebeler, C. H. Joyner, and B. I. Miller, that the diode characteristics of a p-i-n structure with InGaAs/InP QWs degrades significantly after an implantation and annealing process. However, in the sample used in this invention, no degradation was observed in the I-V characteristics of the diode after QW intermixing has occurred, except for a very slight increase in the current at large reverse biases. However, this could be a consequence of the modified shape of the QW. Notwithstanding, for all the diodes made from intermixed QWs, no break-down occurs for reverse-bias up to 15 volts. The preservation of good electrical properties in the devices in accordance with this invention is likely due to the fact that no damage was directly created in the junction area by ion implantation, and that a small ion dose implanted at a substrate temperature of 200° C. and a low annealing temperature was used.

Figure 2:
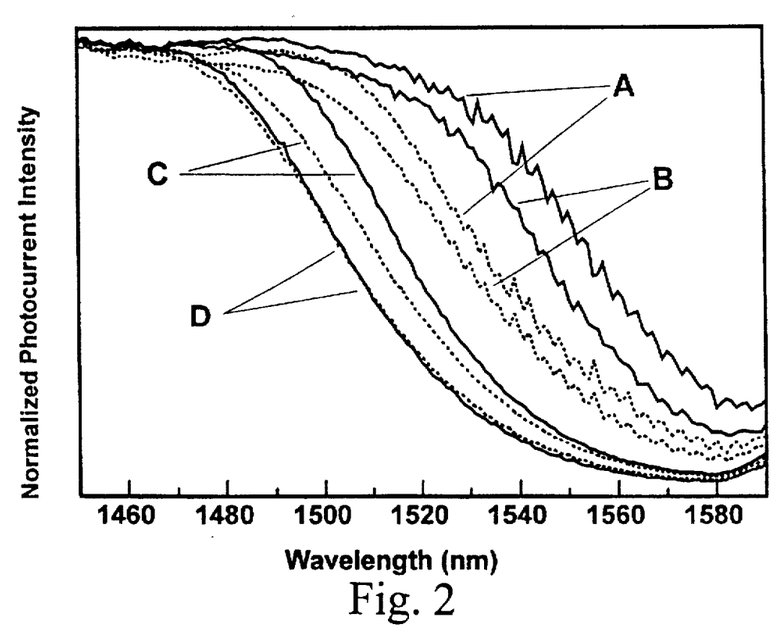
FIG. 2 is a graph of Flatband photocurrent (absorption) spectra of intermixed quaternary QW waveguides as a function of the magnitude of QW intermixing for two orthogonal light polarizations (TE-solid lines, TM-dashed lines)

In accordance with this invention, when QWs are intermixed using ion implantation enhanced interdiffusion, QW bandgaps increase (blue shift to higher energies, shorter wavelengths) and the LH-HH bandgap energy splitting decreases significantly. This is illustrated in FIG. 2, which shows the flatband TE and TM bandgap energies for a series of QW waveguides with various amounts of QW intermixing (A is as-grown (unmixed) and B to D correspond to increasing levels of QW shape modification). In a preferred embodiment, at a certain level of intermixing (D), the flatband LH-HH bandgap energy splitting is reduced to zero, to within experimental uncertainties, while the quantum confined Stark effect is still operative, as demonstrated in FIG. 3. In this case the optical properties of the QW waveguide are polarization independent for most values of external bias. For larger internal electric fields, the valence band dependence of the Stark effect reintroduces a minor polarization dependence. But clearly, over a wide range of typical operating parameters, this QW waveguide structure performs in a polarization independent fashion.

Figure 3:
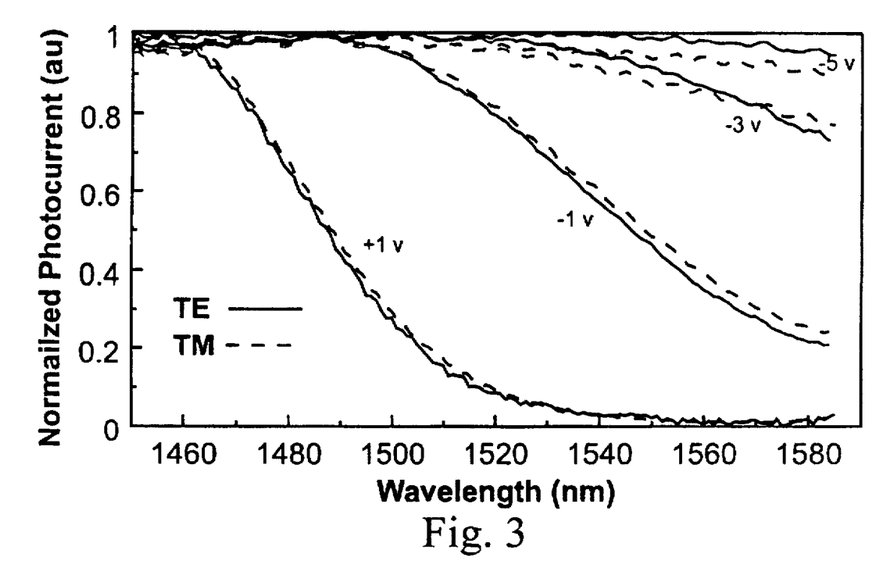
FIG. 3 is a graph of photocurrent (absorption) spectra of an intermixed quaternary QW waveguide as a function of external bias and for two orthogonal polarizations of the waveguide modes.
Figure 4:
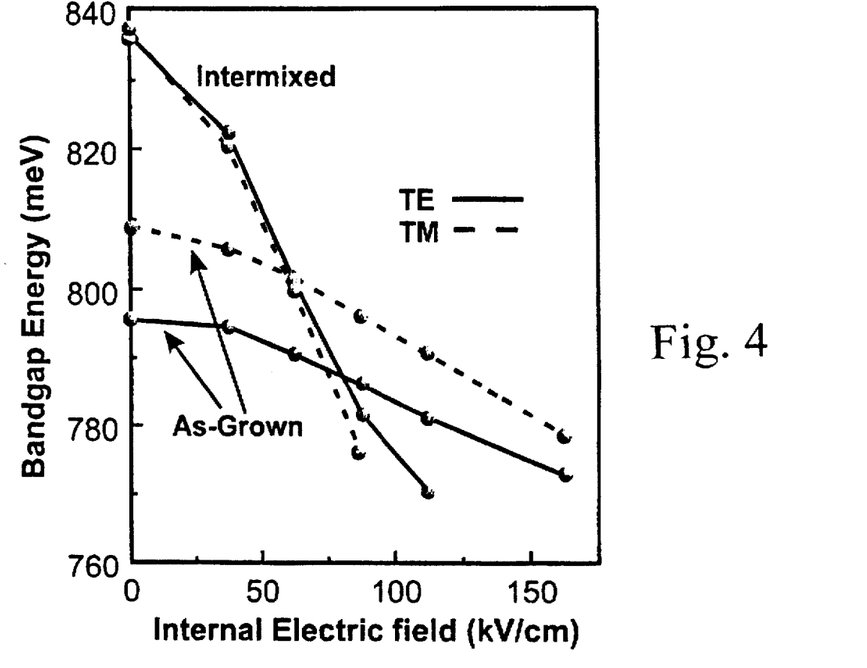
FIG. 4 is a graph of bandgap energy for as-grown and intermixed QW waveguides as a function of internal electric fields for light polarized in two orthogonal directions (TE and TM) with respect to the plane of the waveguide.

Furthermore, the dependence of the bandgap energy on internal electric field is significantly enhanced in this intermixed QW waveguide, as can be determined by comparing FIGS. 1b and 3. FIG. 4 illustrates this effect dramatically by plotting the TE and TM bandgap energies of as-grown and intermixed QW waveguides as a function of electric field. For an internal electric field of about 75 kV/cm, as-grown QW bandgaps are red-shifted by about 10 meV at best while intermixed QWs experience a decrease of about 50 meV. This significant enhancement of the quantum confined Stark effect is undoubtedly due to the increased ability of the electric field to separate the electrons and holes in rounded QWs compared with QWs with "vertical" walls. Notwithstanding, it is clear that QW intermixed waveguides can function as polarization independent photodetectors and as enhanced quantum confined Stark effect (electro-absorptive) modulators. Furthermore, the same technology (QW shape modification) can be used to monolithically integrate such devices together on a single wafer along with other active (e.g., lasers and optical amplifiers) and passive (transparent waveguides) structures. Referring now to FIG. 1b, the photocurrent spectra is shown, which is essentially equivalent to the absorption spectra of the waveguide, of the as-grown InGaAs/InGaAsP QW waveguide structure as a function of the applied external bias and the polarization of the light. The output from a tunable external cavity diode laser was coupled into the waveguide via a tapered, polarization-maintaining fiber and the photocurrent was measured as a function of wavelength. Under zero internal electric field conditions (achieved with an external bias of +1 volt), bandgap energies for both TE and TM polarizations can be readily determined as mentioned previously. These differ since quantum confinement lifts the LH, HH valence band degeneracy at the Brillouin zone center. As the external bias is increased, these bandgaps red shift—to smaller energies (longer wavelengths)—due to the quantum confined Stark effect. These results are typical for semiconductor waveguides containing QWs and illustrate the large Stark shifts possible with QW structures due to the strong carrier confinement in quantum well layers. It also illustrates the polarization sensitivity of such QW waveguide photodetectors, modulators, etc.

Our understanding of this induced degeneracy of the TE and TM waveguide modes proceeds from the assumption that, after QW intermixing, lattice matched, nominally unstrained, InGaAs/InGaAsP QWs are strained in some complex manner due to the movement of, in this example, group III (Ga and In) and group V (As and P) atoms during the interdiffusion processes. This mechanism has been modeled by W. C. Shiu, J. Micallef, I. Ng and E. H. Li, Jpn. J. Appl. Phys. 34 1778 (1995); J. Micallef, E. H. Li and B. L. Weiss, J Appl. Phys. 73, 7524 (1993), by assuming different diffusion lengths, $\Delta_{III}$ or $\Delta_V$, for the cations and anions. The parameter of importance is the ratio of diffusion lengths, $k=\Delta_V/\Delta_{III}$. For a InGaAs/InGaAsP QW interdiffusion involving only one sublattice, or where the degree of interdiffusion on the group III and group V sublattices differs considerably ($\Delta_{III} \neq \Delta_V$), will result in a strained material system. The effect of interdiffusion on the energy band profile (including strain effects) and confined states for valence and conduction bands has also been modeled using error function distributions for the anions and cations to predict compositional profiles that result after implantation and annealing. The findings of Shiu et al. indicate that theoretically, controlling the splitting between light hole and heavy hole bands is achievable using strain within the layers. It is further indicated by Shiu et al. that interesting results may be discovered in future by controlling the, no particularly useful results are noted and, further, as no actual semiconductor devices were built for the above noted application, discovery of practicable inventions did not occur.

Figure 5:
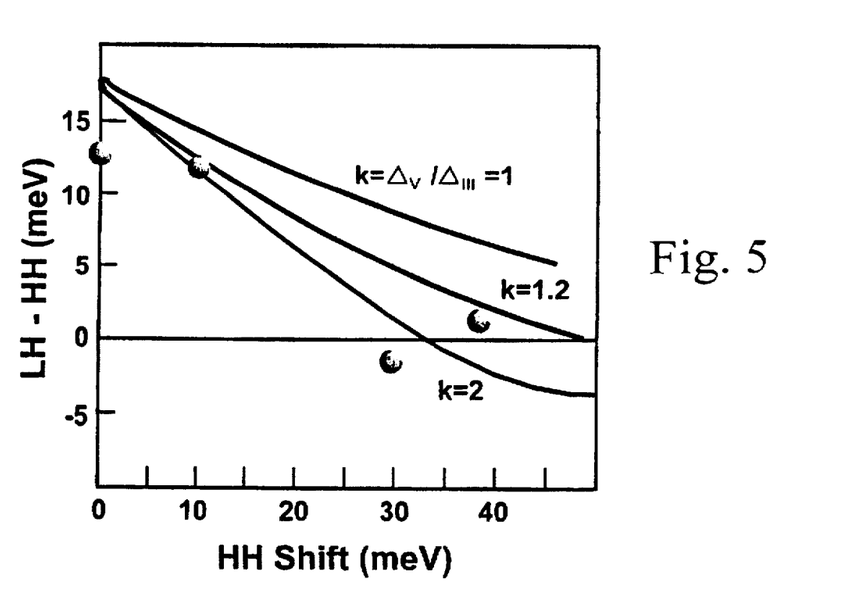
FIG. 5 is a graph in the form of a comparison of experimental heavy-light hole bandgap splitting as a function of heavy hole shift after implantation and annealing with theory for different interdiffusion length ratios, k. The experimental data points were obtained under flatband conditions.

For a given QW structure, the LH-HH energy splitting as a function of HH energy can be calculated for various values of k and compared with experimental values obtained near flat band conditions as shown in FIG. 5. From this analysis, it is clear that our experimental data can only be explained by assuming k>1.5. Scatter in the data and a decreasing sensitivity of LH-HH splitting on increasing k values preclude a more accurate determination of the ratio. For such values of k, a tensile strain develops at the quantum well center, as reported by Shiu et al. Larger values of k lead to higher tensile strains. Furthermore, the Shiu et al have shown that in the early stages of interdiffusion, a significantly larger blue shift is expected for k>1 than that for k<1. Results for a model in which the QW is assumed to remain square and unstrained, as suggested by Temkin et al, in Appl. Phys. Lett. 50, 956 (1987), are very similar to those shown for k=1 and thus do not explain our data. It has been reported by F. Agahi, Kei May Lau, Emil S. Koteles, A. Baliga, and N. G. Anderson, IEEE J Quant. Electron. 30, 459 (1994), that in tensile strained QWs the LH-HH splitting can be reduced and even reversed for large values of strain. This is due to the effect of tensile strain which acts on valence bands in an opposite direction to that of quantum confinement. However, to exactly balance the quantum confinement splitting with the negative splitting due to tensile strain requires precise control of strains (i.e., compositions) and QW thicknesses.

In contrast, according to the model discussed above in accordance with the invention, and our experimental data as shown in FIG. 5, using QW intermixing to accomplish LH, HH degeneracy is a much easier task since the degeneracy, in this case, is not a very sensitive function of HH bandgap shift.

The performance of such polarization independent structures when operated under extreme conditions was considered, such as those experienced by semiconductor optical amplifiers which require large forward currents for population inversion. To investigate the optical amplification characteristics of this waveguide structure, signal gains for the TE and TM modes were measured as a function of wavelength. Light was coupled into, and out of, the waveguide while a fixed forward driving current density of 1.33 kA/cm$^2$ was applied to both the as-grown and intermixed devices.

Figure 6:
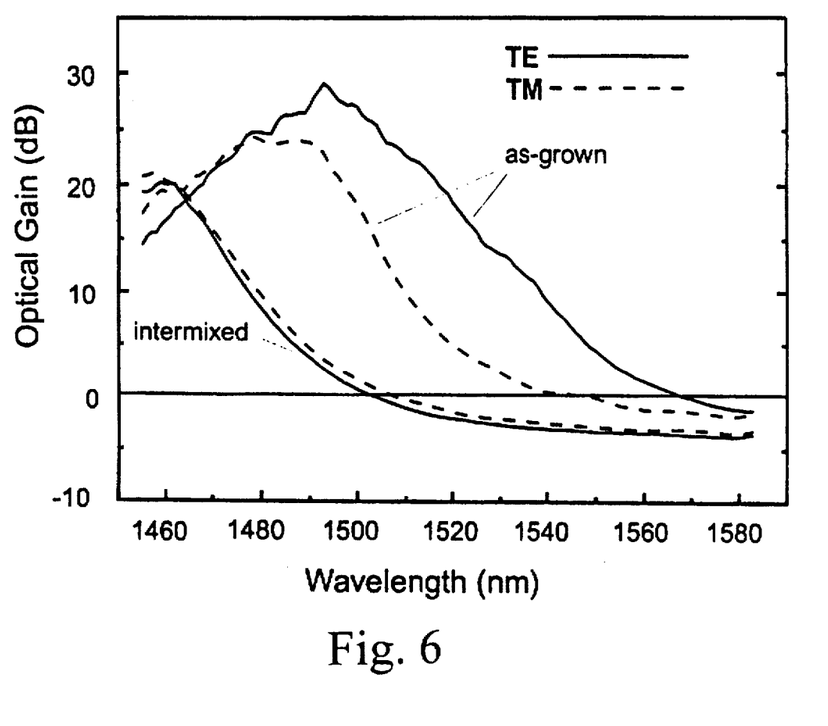
FIG. 6 is a graph of optical gain spectra for TE and TM polarizations for waveguides containing InGaAs/InGaAsP as-grown and intermixed QWs for two waveguide polarizations (TE-dashed lines and TM-solid lines)

FIG. 6 shows that a maximum optical amplification of about 25-30 dB was determined for both polarization states in the waveguide containing as-grown QWs. However, in a behaviour analogous to that observed in FIG. 1a, the optical gain spectra for the TE and TM modes are significantly different due to the quantum confinement splitting of the HH and LH valence bands. On the other hand, in the intermixed QW waveguide, the optical gain spectra of the TE and TM modes overlap, a consequence of the degeneracy of the LH and HH valence bands. Also, the bandgaps for both TE and TM polarization modes were blue-shifted due to the QW shape modification effect. As a consequence, the optical gain spectra could only be determined down to about 1450 nm due to range limitations of our external cavity diode laser. However, the optical amplification of this waveguide structure containing the intermixed QWs is polarization insensitive, as expected.

Figure 7A:
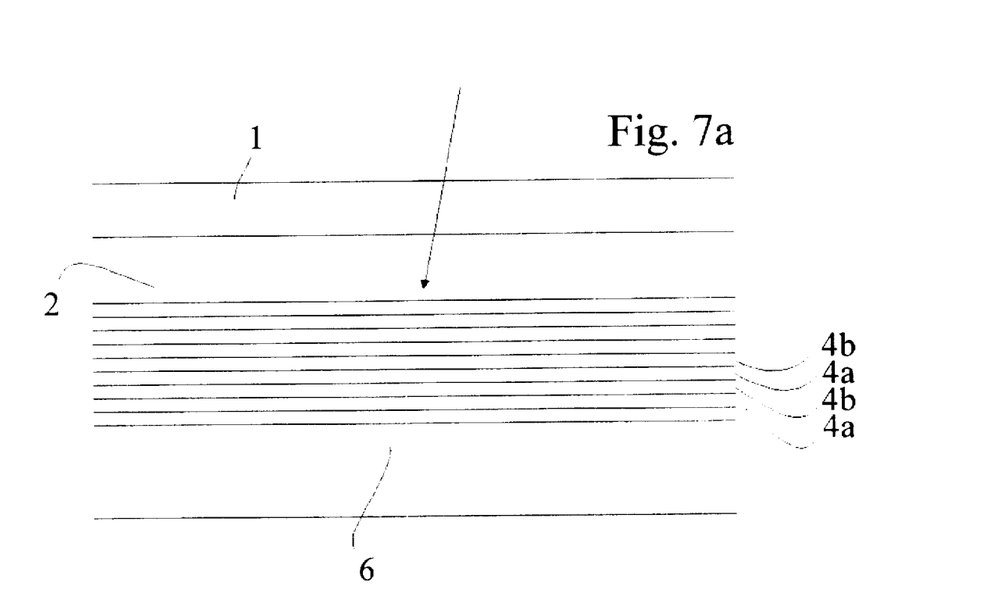
FIGS. 7a and 7b are a simplified diagram of a quantum well structure deposited on a substrate.
Figure 7B:
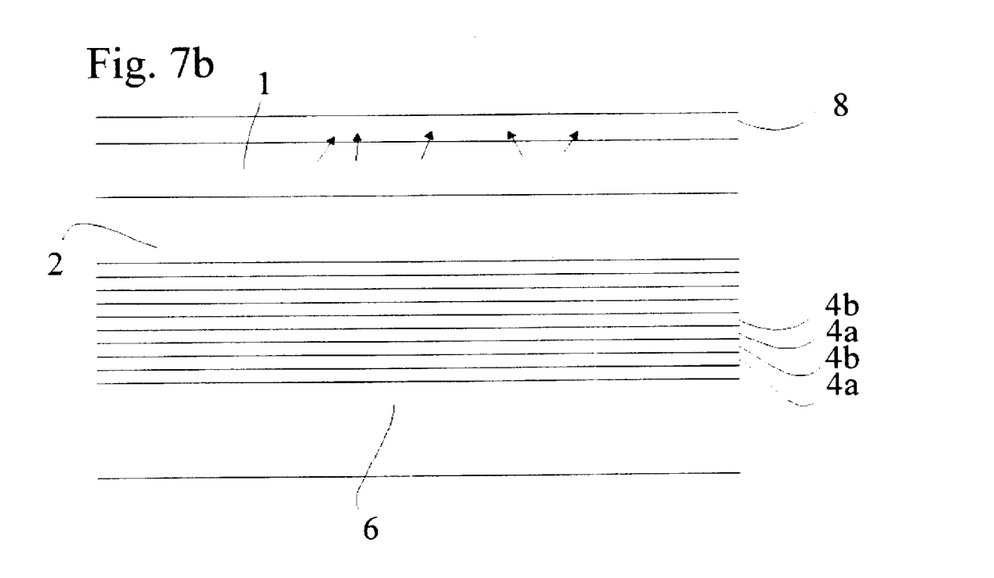

Referring to FIGS. 7a and 7b, a quantum well structure is shown having a layer of InGaAs 1, a layer of InP 2, a plurality of stacked boundary and well layers 4a and 4b, and a substrate of InP 6. Alternatively, other semiconductor materials are used. QWs formed of semiconductor materials and having a structure such as that shown, are well known.

Referring to FIG. 7a, ion implantation is shown. Ions, for example P+, are implanted through the layer 1 to form "defects" in layer 2. Sufficient intermixing at the barrier-well interface, through the generation of defects from the implanted ions, results in a structure according to the invention. Referring to FIG. 7b, a layer of SiO$_2$ is deposited onto the QW structure and, with the addition of heat causes Ga atoms to migrate from the layer 1 leaving "defects" therein. Sufficient intermixing using these "defects", results in a structure according to the invention.

Figure 8A:
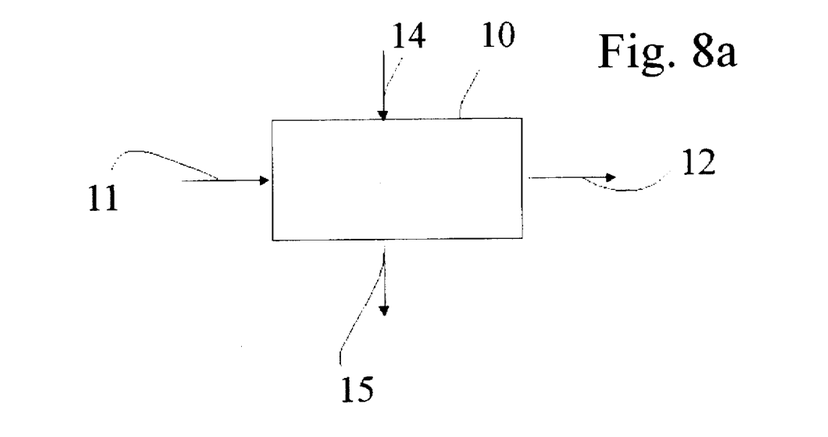
FIG. 8a is a simplified block showing inputs and output ports for a generic QW device.

Referring to FIG. 8a, a QW opto-electronic device is shown. QW devices are known to have various applications. The generic quantum well device shown in FIG. 8a is provided with an electrical input port 11, an electrical output port 12, an optical input port 14, and an optical output port 15. When used as a waveguide, a first voltage in the form of 0 volts is applied at the electrical input port 11. An optical signal provided at the optical input port 14 is passed to the optical output port 15 substantially unchanged. When used as a detector, a second voltage in the form of a negative voltage is applied to the electrical input port 11. An optical signal received at the optical input port 14 is converted to an electrical signal and provided to the electrical output port 12. When used as an amplifier, a third voltage in the form of a positive voltage is applied to the electrical input port 11. Light received at the optical input port 14 is amplified and provided to the optical output port 15.

A QW device is also useful as a tap. When used as a tap, a fourth voltage between the first and second voltage is applied to the electrical input port 11 allowing some of an optical signal received at the optical input port 14 to pass to the optical output port 15 and some of the optical signal to be converted to an electrical signal and provided to the electrical output port 12. When used as a switch or as a modulator, a voltage provided at the electrical input port 11 is varied from a first voltage to second voltage. This effectively results in two states, a first state where the device acts as an detector and a second state where the device acts as a waveguide. Alternatively, two states are achieved by applying a second voltage and third voltage to the electrical input port 11 and the device acts as a detector and amplifier respectively.

Figure 8B:
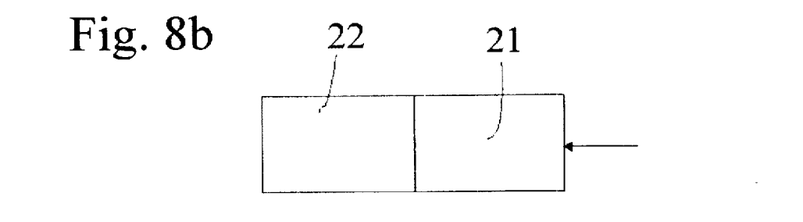
FIG. 8b is a simplified block diagram of an integrated optical amplifier/detector; and, FIG. 8c is a simplified block diagram of an integrated optical amplifier/optical switch circuit.

Referring to FIG. 8b, an optical detector is shown in block diagram. The detector comprises an amplifier 21, and a detector 22. Alternatively, a waveguide (not shown) is disposed between the amplifier 21 and the detector 22. As a received signal's polarization is unknown, the polarization sensitivity of such a device is of considerable concern. Using a QW device according to the present invention, addresses this concern.

Figure 8C:
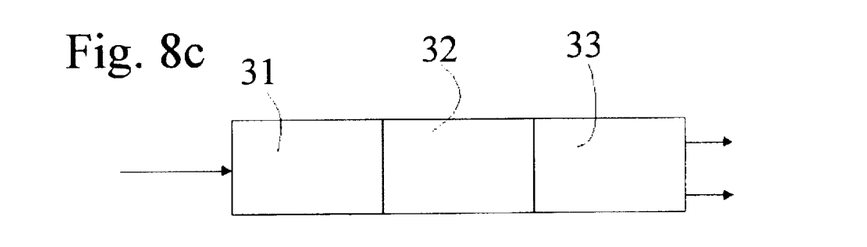

Referring to FIG. 8c, an optical switch is shown in block diagram. Switching optical signals having unknown polarization has many applications and, using the QW device of this invention, a polarization independent optical switch is provided. The switch comprises an amplifier 31, a waveguide 32 and a switch 33—each formed of a QW device according to the present invention.

In summary, in accordance with this invention, high energy ion implantation induced QW shape modification is used to fabricate polarization insensitive photonic devices such as photodetectors, quantum confined Stark effect modulators, and optical amplifiers in MQW laser structures. The spatial selectivity inherent in this technique makes it useful for the monolithic integration of optoelectronic devices having different functionalities.

Of course numerous other embodiments using a variety of other materials can be envisaged without departing from the spirit and scope of the invention.

What is claimed is:

1. An active semiconductor device that performs in a substantially polarization independent manner, comprising:
   a quantum well waveguide wherein barrier and well layers of at least a quantum well are intermixed by intermixing atoms across an interface between well and barrier layers, said atoms comprising at least 2 groups wherein intermixing of one group is at a substantially greater rate than another group, said intermixing being sufficient to provide strain within layers of said waveguide and being sufficient to at least partially degenerate light hole and heavy hole bands of the structure.

2. An active semiconductor device as defined in claim 1, wherein the device comprises at least one of an optical amplifier, an optical detector, an optical switch, and an optical modulator.

3. An active semiconductor device that performs in a substantially polarization independent manner, comprising:
   an intermixed quantum well waveguide structure, said intermixing being sufficient to substantially degenerate the light and heavy hole bands of the structure.

4. An active semiconductor device that performs in a substantially polarization independent manner as defined in claim 1 wherein the strain within the layers is sufficient to substantially degenerate light and heavy hole bands of the structure.

5. A post growth method of fabricating an active semiconductor device that is substantially polarization independent to incident light launched therein, comprising the steps of:
   providing an active semiconductor device having at least a quantum well waveguide; intermixing by interdiffusing two groups of atoms across an interface between barrier and well layers of the at least a quantum well waveguide, one group of atoms being diffused at a substantially greater rate than another group, said intermixing being sufficient to provide strain within layers of said waveguide and being sufficient to substantially degenerate light and heavy hole bands of the waveguide.

6. An active semiconductor device that performs in a substantially polarization independent manner, comprising:
   a quantum well waveguide wherein barrier and well layers of at least a quantum well are intermixed through implantation and interdiffusion of anions and cations and subsequent annealing, one of said anions and cations being interdiffused at a greater rate than another of said anions and cations across interfaces between well and barrier layers, said intermixing being sufficient to provide strain within layers of said waveguide and being sufficient to at least partially degenerate light hole and heavy hole bands of the structure.

7. An active semiconductor device that performs in a substantially polarization independent manner as defined in claim 6 wherein the strain within the layers is sufficient to substantially degenerate light and heavy hole bands of the structure.

8. An active semiconductor device that performs in a substantially polarization independent manner as defined in claim 6 wherein said anions are interdiffused at a greater rate than said cations across interfaces between well and barrier layers.

9. An active semiconductor device that performs in a substantially polarization independent manner as defined in claim 6 wherein said cations are interdiffused at a greater rate than said anions across interfaces between well and barrier layers.

10. A post growth method of fabricating an active semiconductor device that is substantially polarization independent to incident light launched therein as defined in claim 5 wherein the substantially greater rate is at least 25% greater.

11. A post growth method of fabricating an active semiconductor device that is substantially polarization independent to incident light launched therein as defined in claim 5 wherein the substantially greater rate is at least 50% greater.

12. An active semiconductor device that performs in a substantially polarization independent manner as defined in claim 1 wherein intermixing of atoms is across well and barrier layers.

13. An active semiconductor device that performs in a substantially polarization independent manner as defined in claim 5 wherein intermixing of atoms is across well and barrier layers.

14. An active semiconductor device that performs in a substantially polarization independent manner as defined in claim 6 wherein intermixing of atoms is across well and barrier layers.

* * * * *